United States Patent
Kim et al.

(10) Patent No.: US 8,811,069 B2
(45) Date of Patent: Aug. 19, 2014

(54) MEMORY DEVICE AND SYSTEMS INCLUDING THE SAME

(75) Inventors: Gyu Hong Kim, Seoul (KR); Jong Hoon Jung, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 3 days.

(21) Appl. No.: 13/591,696

(22) Filed: Aug. 22, 2012

(65) Prior Publication Data
US 2013/0051129 A1 Feb. 28, 2013

(30) Foreign Application Priority Data

Aug. 22, 2011 (KR) .................. 10-2011-0083545

(51) Int. Cl.
*G11C 11/00* (2006.01)

(52) U.S. Cl.
USPC .......................................... 365/154; 365/205

(58) Field of Classification Search
CPC ................................ G11C 11/412; G11C 7/22
USPC ............................................ 365/154, 205, 203
See application file for complete search history.

(56) References Cited

U.S. PATENT DOCUMENTS

| | | | |
|---|---|---|---|
| 7,161,855 B2 | 1/2007 | Kodama | |
| 7,483,327 B2 | 1/2009 | Qureshi et al. | |
| 7,701,792 B2 | 4/2010 | Oh | |
| 2003/0067812 A1* | 4/2003 | Kajimoto | 365/189.01 |
| 2004/0160833 A1* | 8/2004 | Suzuki | 365/194 |
| 2004/0264277 A1* | 12/2004 | Song | 365/205 |
| 2011/0090750 A1 | 4/2011 | Arsovski et al. | |

* cited by examiner

*Primary Examiner* — Huan Hoang
(74) *Attorney, Agent, or Firm* — Sughrue Mion, PLLC

(57) ABSTRACT

The memory device includes a memory cell array, an access control circuit configured to access the memory cell array, a control signal generation circuit configured to generate a control signal for controlling an operation of the access control circuit, and a variable delay circuit configured to generate a delay signal by variably delaying a clock signal according to an external signal. The control signal generation circuit adjusts an activation timing of the control signal in response to the delay signal.

17 Claims, 12 Drawing Sheets

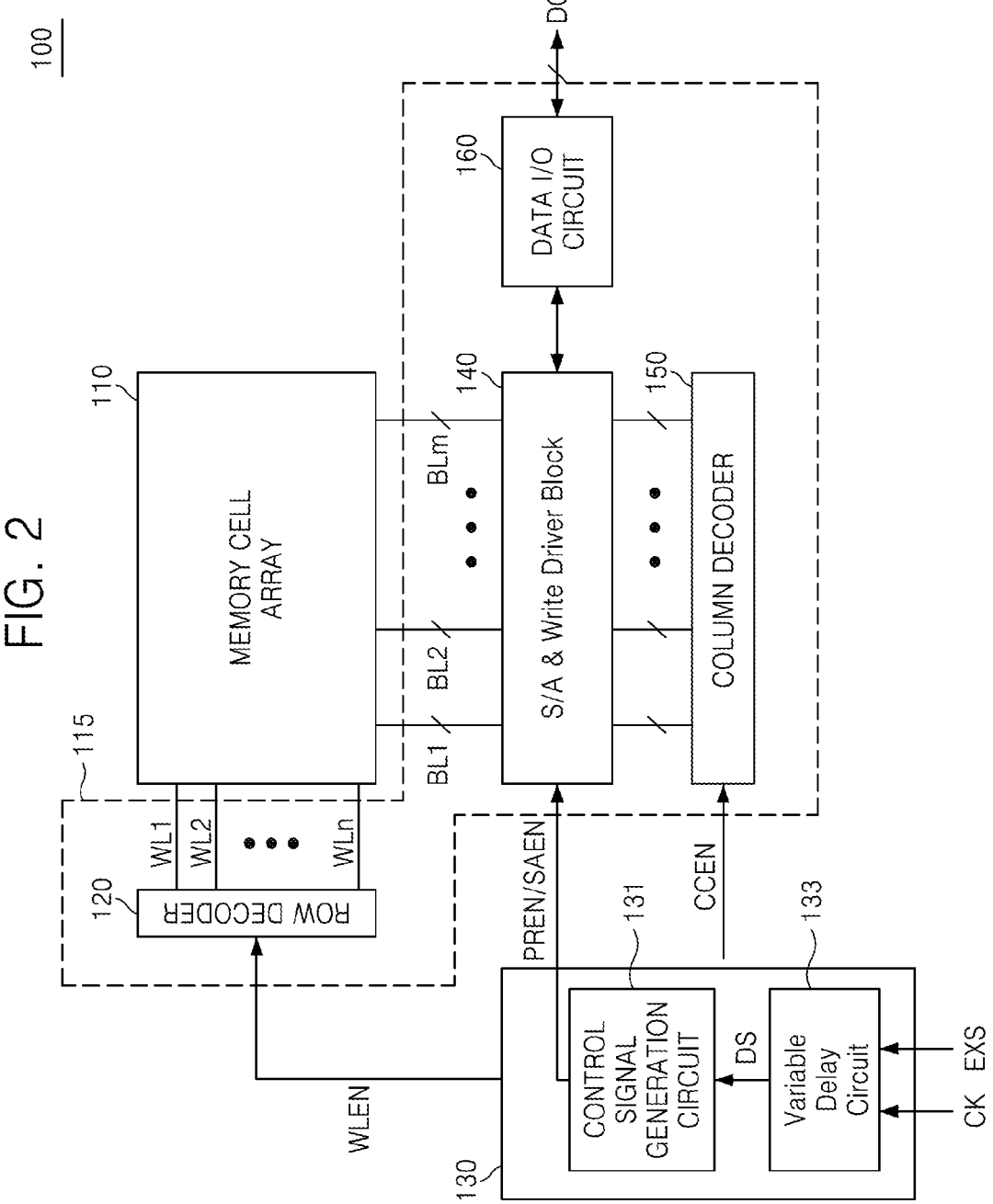

MEMORY DEVICE AND SYSTEMS INCLUDING THE SAME

CROSS-REFERENCE TO RELATED APPLICATION

This application claims priority under 35 U.S.C. §119(a) from Korean Patent Application No. 10-2011-0083545 filed on Aug. 22, 2011, the disclosure of which is hereby incorporated by reference in its entirety.

BACKGROUND

1. Field

Apparatuses, devices, controllers, and systems consistent with the present inventive concept relate to a memory device, and more particularly, to a memory device for controlling an activation timing of a control signal for operating the memory device using a variable delay circuit and systems including the same.

2. Description of the Related Art

Semiconductor devices are divided into static random access memory (SRAM) that stores data using a latch and dynamic random access memory (DRAM) that stores data using a capacitor.

As the size of an SRAM cell decreases with the development of process technology, the distribution of a basic process characteristic of a transistor included in the memory cell increases and the distribution of an SRAM characteristic such as a write margin, a static noise margin or a sense margin also increases.

Due to these phenomena, an operation error occurs when an SRAM is operated using a delay set in the design stage. Since the delay cannot be changed in a related art SRAM, an SRAM having the operation error is rejected as faulty. As a result, the yield of the SRAM decreases.

SUMMARY

According to an aspect of one or more exemplary embodiments, there is provided a memory device including a memory cell array, an access control circuit configured to access the memory cell array to perform a read operation or a write operation, a control signal generation circuit configured to generate a control signal for controlling an operation of the access control circuit, and a variable delay circuit configured to generate a delay signal by variably delaying a clock signal according to an external signal. The control signal generation circuit may adjust an activation timing of the control signal in response to the delay signal.

The variable delay circuit may include a delay setting circuit configured to set an amount of delay of the variable delay circuit according to the external signal, and a delay circuit configured to generate the delay signal by variably delaying the clock signal according to the amount of delay. The delay setting circuit may include a register configured to store the amount of delay.

The delay circuit may include a plurality of delay elements connected in series to each other, and each of the delay elements may be a buffer or an inverter. Alternatively, the delay setting circuit may include a plurality of fusing elements, and the amount of delay may be determined according to a number of the fusing elements which are cut, or according to a number of the fusing elements which are uncut. The memory device may be a static random access memory (SRAM).

The control signal may be a sense amplifier enable signal for controlling an operation of a sense amplifier, a precharge enable signal for controlling the operation of the sense amplifier, a word line enable signal for controlling an operation of a row driver, or a column decoder enable signal for controlling an operation of a column decoder.

According to another aspect of one or more exemplary embodiments, there is provided a memory controller including a memory device and a microprocessor configured to control an operation of the memory device. The memory device may include a memory cell array, an access control circuit configured to access the memory cell array to perform a read operation or a write operation, a control signal generation circuit configured to generate a control signal for controlling an operation of the access control circuit, and a variable delay circuit configured to generate a delay signal by variably delaying a clock signal according to an external signal. The control signal generation circuit may adjust an activation timing of the control signal in response to the delay signal.

According to another aspect of one or more exemplary embodiments, there is provided a memory system including a nonvolatile memory and the above-described memory controller configured to control an operation of the nonvolatile memory device. The memory controller may write data output from the nonvolatile memory to the memory device using the access control circuit and transmit data from the access control circuit to the nonvolatile memory.

According to another aspect of one or more exemplary embodiments, a memory system includes a display, a nonvolatile memory, and the above-described memory controller configured to transmit data from the nonvolatile memory to the display. The memory controller may write data output from the nonvolatile memory to the memory device using the access control circuit and transmit data from the access control circuit to the nonvolatile memory.

According to another aspect of one or more exemplary embodiments, a memory card includes a card interface, a nonvolatile memory, and the above-described memory controller configured to interface with the card interface and the nonvolatile memory for data transmission.

According to another aspect of one or more exemplary embodiments, a solid state drive includes at least one nonvolatile memory, the above-described memory controller configured to control a data processing operation of the at least one nonvolatile memory device, and a buffer manager configured to control data transmitted between the memory controller and a host to be stored in a volatile memory device.

BRIEF DESCRIPTION OF THE DRAWINGS

The above and other aspects and advantages will become more apparent by describing in detail exemplary embodiments thereof with reference to the attached drawings in which:

FIG. 2 is a block diagram of a memory device according to an exemplary embodiment;

DETAILED DESCRIPTION

Figure 1:
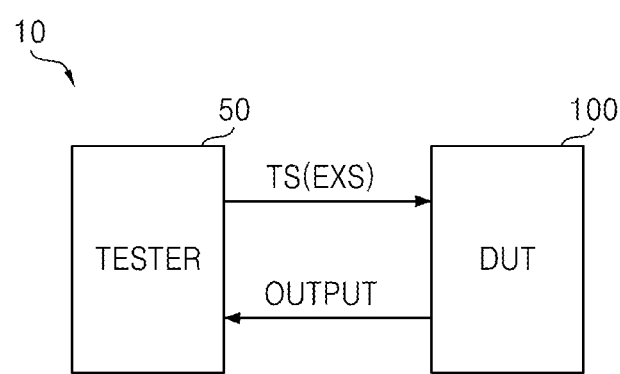
FIG. 1 is a diagram for explaining a procedure for testing a memory device according to one or more exemplary embodiments.

Exemplary embodiments now will be described more fully hereinafter with reference to the accompanying drawings. The exemplary embodiments may, however, be embodied in many different forms and should not be construed as limited to the embodiments set forth herein. Rather, these exemplary embodiments are provided so that this disclosure will be thorough and complete. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a diagram for explaining a procedure for testing a memory device according to one or more exemplary embodiments. Referring to FIG. 1, a test system 10 includes a tester 50 and a device under test (DUT) 100 that is a target of a test.

The tester 50 transmits a test signal TS to the DUT 100, analyzes output data OUTPUT from the DUT 100, and determines whether the DUT 100 is a good chip or a bad chip based on an analysis result. The DUT 100 is a target of a test. A memory device according to one or more exemplary embodiments corresponds to the DUT 100 in the test procedure.

In testing the memory device 100, the memory device 100 receives the test signal TS from the tester 50 and transmits the output data OUTPUT to the tester 50 in response to the test signal TS. The output data OUTPUT may be data related with a write (or program) operation or a read operation performed on the memory device 100.

The tester 50 analyzes the output data OUTPUT and determines whether a read failure or a write failure has occurred in the memory device 100 based on an analysis result.

When it is determined that the read or write failure has occurred, the tester 50 changes the test signal TS and tests the operation of the memory device 100. For instance, when the test signal TS is a test code including a plurality of bits, the tester 50 repeatedly changes the test code and tests the read or the write operation of the memory device 100 until the result of testing the memory device 100 is "read pass" or "write pass".

A test code with respect to which the read pass or the write pass occurs is referred to as an external signal EXS. The amount of delay in a clock signal of the memory device 100 is determined according to the external signal EXS. The external signal EXS may be a digital signal including a plurality of bits.

FIG. 2 is a block diagram of the memory device 100 of FIG. 1 according to one or more exemplary embodiments. Referring to FIG. 2, the memory device 100 includes a memory cell array 110, an access control circuit 115, and a control circuit 130.

The memory cell array 110 includes a plurality of word lines WL1 through WLn (where "n" is a natural number), a plurality of bit lines BL1 through BLm (where "m" is a natural number), and a plurality of memory cells storing data.

The access control circuit 115 accesses the memory cell array 110 to perform a read operation or a write operation. The access control circuit 115 includes a row decoder 120, a sense amplifier (S/A) & write driver block 140, a column decoder 150, and a data input/output (I/O) circuit 160.

The row decoder 120 decodes a row address and selectively drives one of the word lines WL1 through WLn according to a decoding result. The S/A & write driver block 140 functions as a write driver which writes data received through the data I/O circuit 160 to the memory cell array 110 during the write operation and functions as an S/A which senses and amplifies data output from the memory cell array 110 and transmits the data to the data I/O circuit 160 during the read operation.

The column decoder 150 decodes a column address and generates a plurality of column selection signals according to the decoding result. The S/A & write driver block 140 connects or disconnects the memory cell array 110 and the data I/O circuit 160 in response to the column selection signals. The data I/O circuit 160 transmits external write data DQ to the S/A & write driver block 140 or outputs read data DQ sensed and amplified by the S/A & write driver block 140.

The control circuit 130 generates a plurality of control signals WLEN, PREN, SAEN and CCEN for controlling the operation of the access control circuit 115 and includes a control signal generation circuit 131 and a variable delay circuit 133. The control signal generation circuit 131 controls each activation timing of the control signals WLEN, PREN, SAEN and CCEN for controlling the operation of the access control circuit 115 in response to a delay signal DS output from the variable delay circuit 133.

Figure 3A:
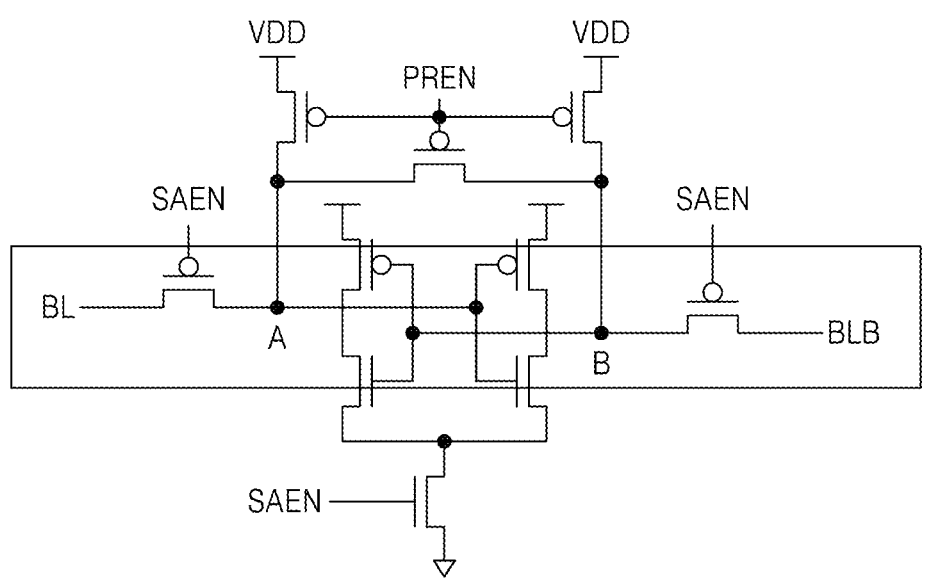
FIG. 3A is a circuit diagram of a sense amplifier included in a sense amplifier and a write drive block illustrated in FIG. 2.

The control signals WLEN, PREN, SAEN and CCEN include the S/A enable signal SAEN and the precharge enable signal PREN for controlling the activation timing of the S/A illustrated in FIG. 3A, the word line enable signal WLEN for controlling the operation of the row decoder 120, and the column decoder enable signal CCEN for controlling the operation of the column decoder 150. The variable delay circuit 133 adjusts the amount of delay in a clock signal CK according to the external signal EXS to generate the delay signal DS delayed for the amount of the delay.

Figure 3B:
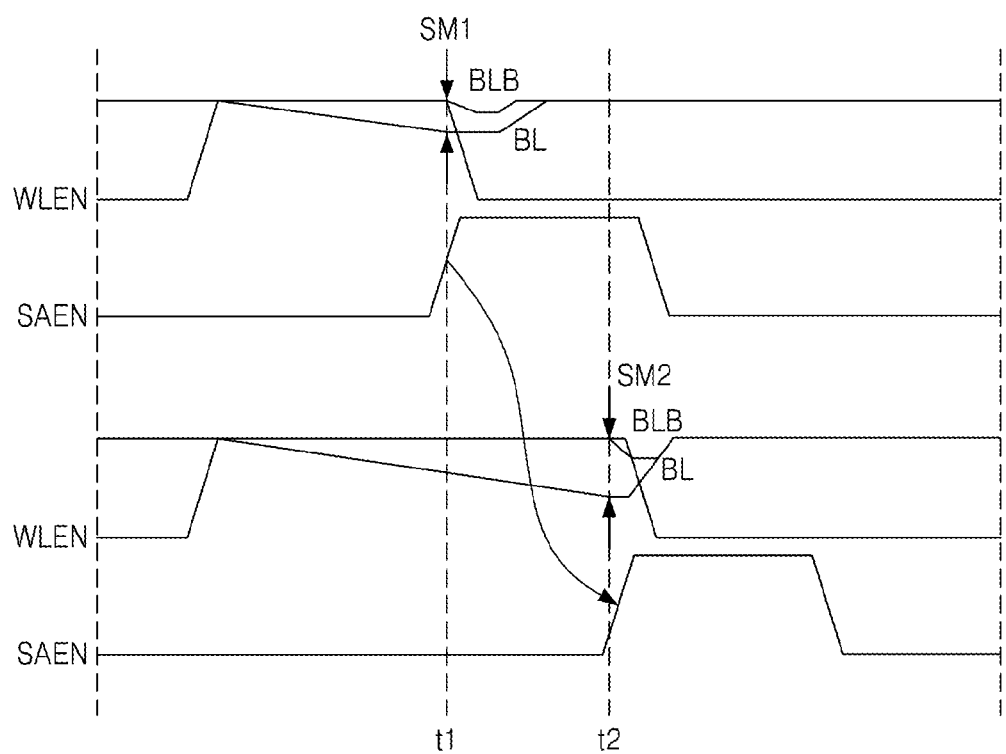
FIG. 3B is a waveform diagram of a word line enable signal and a sense amplifier enable signal that are illustrated in FIG. 2.

FIG. 3A is a circuit diagram of the S/A included in the S/A & write driver block 140 illustrated in FIG. 2. FIG. 3B is a waveform diagram of the word line enable signal WLEN and the S/A enable signal SAEN that are illustrated in FIG. 2.

Referring to FIGS. 3A and 3B, the S/A precharges a first node A and a second node B to a power supply voltage VDD in response to the precharge enable signal PREN and senses and amplifies a voltage of a bit line BL and a voltage of a complementary bit line BLB in response to the S/A enable signal SAEN.

When the S/A enable signal SAEN is activated to a high level at a first time point t1, a first sense margin SM1 corresponding to a difference between the voltage of the bit line BL and the voltage of the complementary bit line BLB is small. However, when the S/A enable signal SAEN is activated to the high level at a second time point t2, a second sense margin SM2 corresponding to a difference between the voltage of the bit line BL and the voltage of the complementary bit line BLB is greater than the first sense margin SM1.

The control signal generation circuit 131 may delay the activation timing of the S/A enable signal SAEN from the first time point t1 to the second time point t2 according to the delay signal DS. Accordingly, as illustrated in FIG. 3B, the sense margin of the S/A increases from the first sense margin SM1 to the second sense margin SM2, thereby improving the operating characteristics of the memory device 100.

Figure 4:
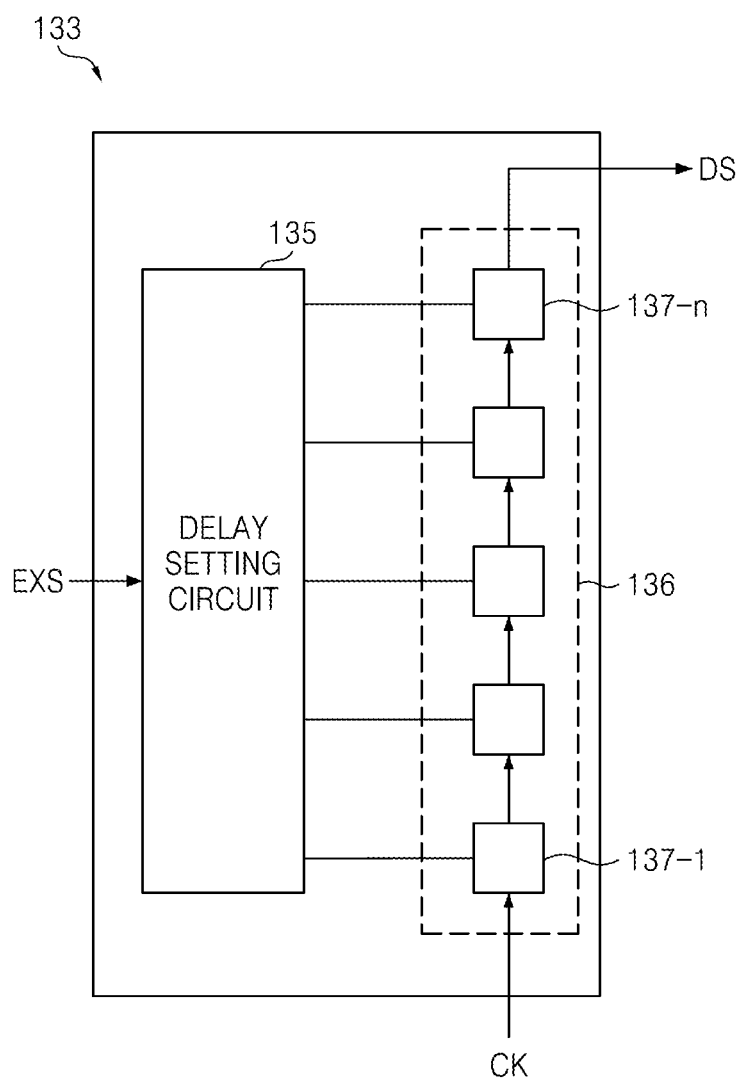
FIG. 4 is a diagram of a variable delay circuit illustrated in FIG. 2.

FIG. 4 is a diagram of the variable delay circuit 133 illustrated in FIG. 2. Referring to FIGS. 2 and 4, the variable delay circuit 133 includes a delay setting circuit 135 and a delay circuit 136.

For instance, the delay circuit 136 includes a plurality of delay elements 137-1 through 137-$n$ (where "n" is a natural number) connected in series to each other.

The variable delay circuit 133 delays the clock signal CK according to the external signal EXS to generate the delay signal DS. The delay setting circuit 135 may set an amount of delay of the delay circuit 136. The delay setting circuit 135 may be implemented as a register that stores the amount of delay set during the test of the memory device 100. The register may store the external signal EXS or a value corresponding to the external signal EXS. In other exemplary embodiments, the delay setting circuit 135 may include a plurality of fusing elements and the amount of delay may be determined by a cut or an uncut state of each of the fusing elements. In this case, the cut or uncut state of the fusing elements may be determined according to a value corresponding to the external signal EXS.

Each of the delay elements 137-1 through 137-$n$ may be a buffer or an inverter and may delay the clock signal CK by the amount of delay set by the delay setting circuit 135 to output the delay signal DS.

Figure 5:
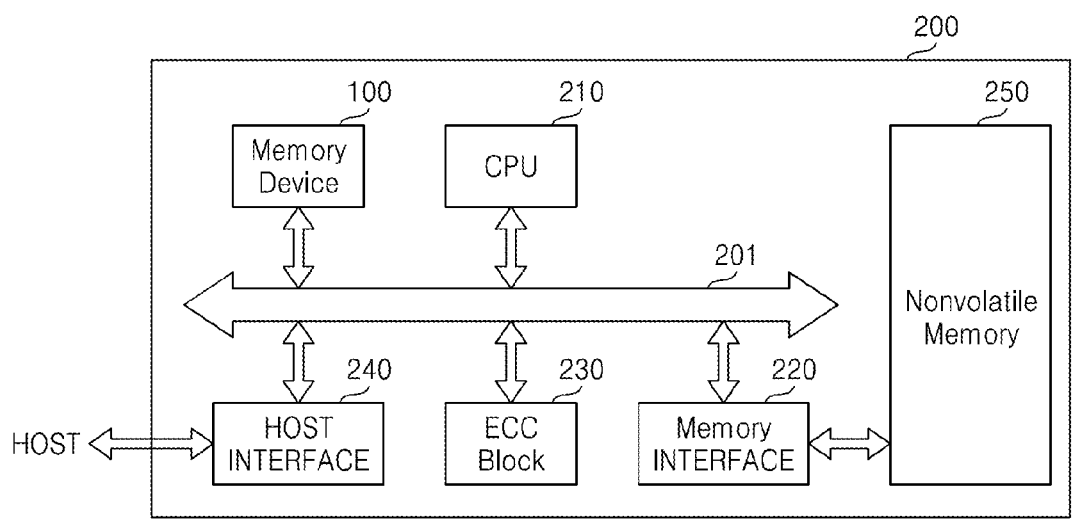
FIG. 5 is a diagram of a memory system including the memory device illustrated in FIG. 2 according to an exemplary embodiment.

FIG. 5 is a diagram of a memory system 200 including the memory device 100 illustrated in FIG. 2 according to one or more exemplary embodiments. Referring to FIG. 5, the memory system 200 includes a nonvolatile memory 250, the memory device 100, and a central processing unit (CPU) 210 controlling the operations of the volatile memory device 100 and the nonvolatile memory 250. The CPU 210 may be a microprocessor. The memory device 100 may be implemented by a volatile memory device.

The memory device 100 may be used as an operation memory of the CPU 210. The memory device 100 may be implemented by a static random access memory (SRAM).

A host HOST connected with the memory system 200 may perform data communication with the nonvolatile memory 250 through a memory interface 220 and a host interface 240. An error correction code (ECC) block 230 is controlled by the CPU 210 to detect an error bit included in data output from the nonvolatile memory 250 through the memory interface 220, correct the error bit, and transmit the error-corrected data to the host through the host interface 240. The CPU 210 may control data communication among the memory interface 220, the ECC block 230, the host interface 240, and the memory device 100 through a bus 201.

The memory system 200 may be implemented as a flash memory drive, a universal serial bus (USB) flash memory drive, an interchip USB (IC-USB) memory drive, or a memory stick.

Figure 6:
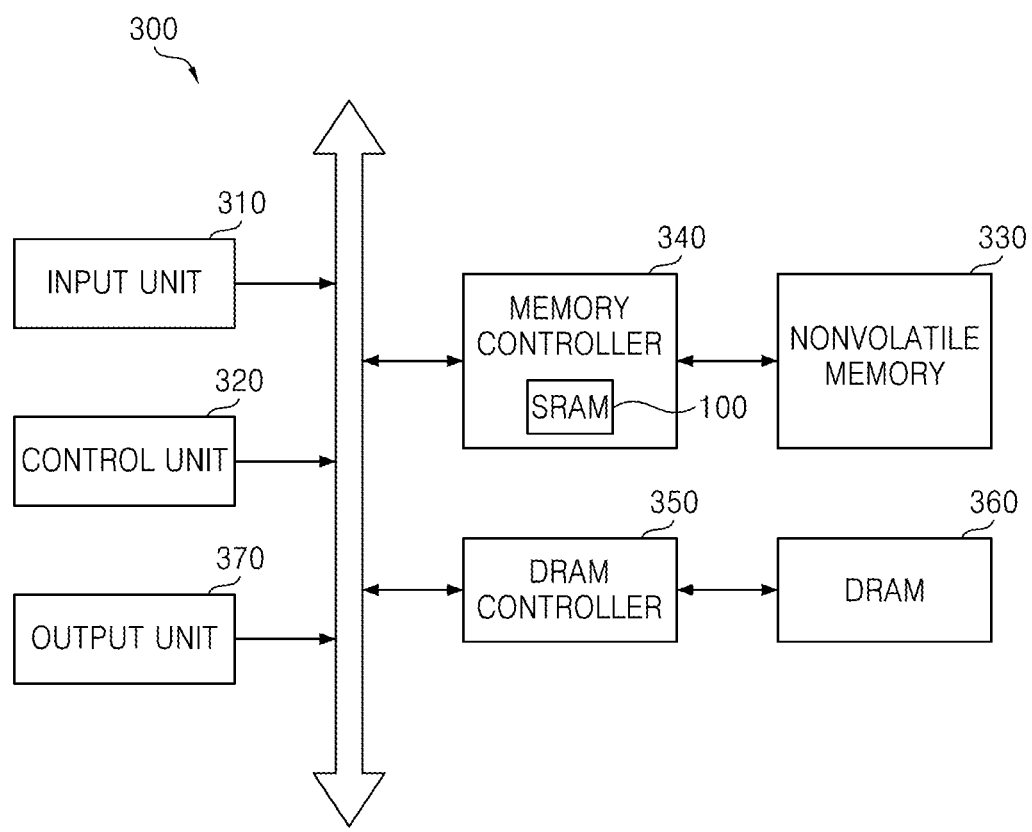
FIG. 6 is a diagram of a memory system including the memory device illustrated in FIG. 2 according to one or more exemplary embodiments.

FIG. 6 is a diagram of a memory system 300 including the memory device 100 illustrated in FIG. 2 according to one or more exemplary embodiments. Referring to FIG. 6, the memory system 300 includes an input unit 310, a control unit 320, a nonvolatile memory 330, a memory controller 340 including the memory device 100 implemented by an SRAM, a dynamic random access memory (DRAM) controller 350, a DRAM 360, and an output unit 370.

The input unit 310 receives an external command. The control unit 320 generates a control signal for executing the command transmitted through the input unit 310. According to the control signal, data stored in the nonvolatile memory 330 is transmitted to the memory controller 340 and is stored in the SRAM 100 within the memory controller 340.

Before transmitting the data output from the nonvolatile memory 330 to the DRAM 360, the memory controller 340 stores the data in the SRAM 100 functioning as a buffer memory. The memory system 300 includes the SRAM 100 functioning as the buffer memory, thereby preventing occurrence of delay that may occur when the data output from the nonvolatile memory 330 is directly stored in the DRAM 360.

The DRAM controller 350 stores data output from the SRAM 100 in the DRAM 360. The data stored in the DRAM 360 may be output through the output unit 370 according to the control of the control unit 320.

Figure 7:
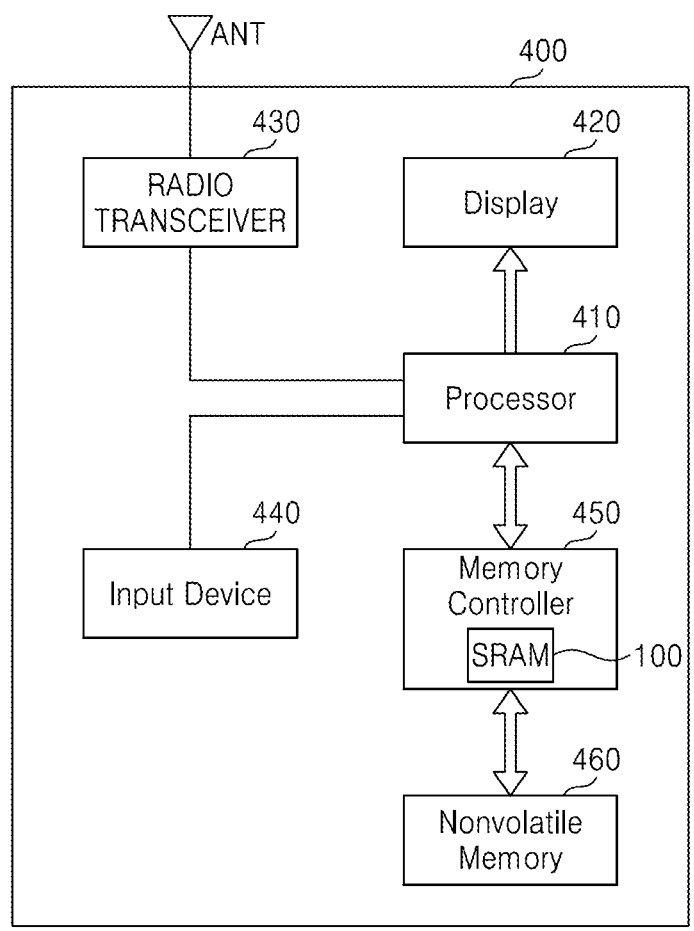
FIG. 7 is a diagram of a memory system including the memory device illustrated in FIG. 2 according to one or more exemplary embodiments.

FIG. 7 is a diagram of a memory system 400 including the memory device 100 illustrated in FIG. 2 according to one or more exemplary embodiments. Referring to FIGS. 2 and 7, the memory system 400 may be implemented as a cellular phone, a smart phone, a tablet personal computer (PC), a personal digital assistant (PDA), a portable multimedia player (PMP), or a radio communication system.

The memory system 400 includes a nonvolatile memory 460 and a memory controller 450 controlling the operations of the nonvolatile memory 460.

The memory controller 450 may control data access operations, e.g., a program operation, an erase operation, and a read operation, etc., of the nonvolatile memory 460 according to the control of a processor 410. The memory controller 450 includes the memory device 100 implemented by an SRAM which stores data output from the nonvolatile memory 460. The SRAM 100 temporarily stores the data output from the nonvolatile memory 460. The data stored in the SRAM 100 is transmitted to the processor 410.

A radio transceiver 430 transmits or receives radio signals through an antenna ANT. The radio transceiver 430 may convert radio signals received through the antenna ANT into signals that can be processed by the processor 410. Accordingly, the processor 410 may process the signals output from the radio transceiver 430 and transmit the processed signals to the memory controller 450 or a display 420. The memory controller 450 may program or write the signals processed by the processor 410 to the nonvolatile memory 460. The radio transceiver 430 may also convert signals output from the processor 410 into radio signals and output the radio signals to an external device through the antenna ANT.

An input device 440 enables control signals for controlling the operation of the processor 410 or data to be processed by the processor 410 to be input to the memory system 400. The input device 440 may be implemented by a pointing device such as a touch pad or a computer mouse, a keypad, or a keyboard.

The processor 410 may control the operation of the display 420 to display data output from the memory controller 450, data output from the radio transceiver 430, or data output from the input device 440.

The memory controller 450, which controls the operations of the nonvolatile memory 460, may be implemented as a part of the processor 410 or as a separate chip.

The memory controller 450 and the nonvolatile memory 460 may be implemented together in a single package, e.g., a multi-chip package.

Figure 8:
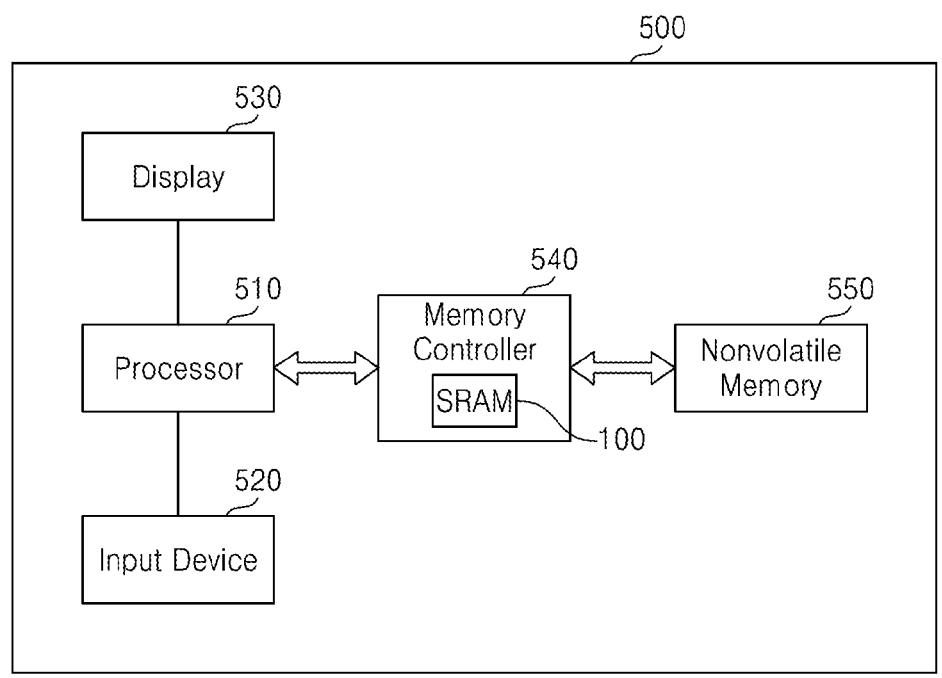
FIG. 8 is a diagram of a memory system including the memory device illustrated in FIG. 2 according to one or more exemplary embodiments.

FIG. 8 is a diagram of a memory system 500 including the memory device 100 illustrated in FIG. 2 according to one or more exemplary embodiments. The memory system 500 may be implemented as a PC, a tablet PC, a netbook, an e-reader, a PDA, a PMP, an MP3 player, or an MP4 player.

The memory system 500 includes a memory controller 540 controlling the data processing operations of a nonvolatile memory 550. The memory controller 540 includes the memory device 100 implemented by an SRAM. The memory controller 540 temporarily stores the data output from the nonvolatile memory 550 in the SRAM 100. The data stored in the SRAM 100 is transmitted to a processor 510.

The processor 510 may display data stored in the nonvolatile memory 550 through a display 530 according to data input through an input device 520. The input device 520 may be implemented by a pointing device such as a touch pad or a computer mouse, a keypad, or a keyboard. The processor 510 may control the overall operation of the memory system 500 and the operations of the memory controller 540.

The memory controller 540, which may control the operations of the nonvolatile memory 550, may be implemented as a part of the processor 510 or as a separate chip. The memory controller 540 and the nonvolatile memory 550 may be implemented together in a single package, e.g., a multi-chip package.

Figure 9:
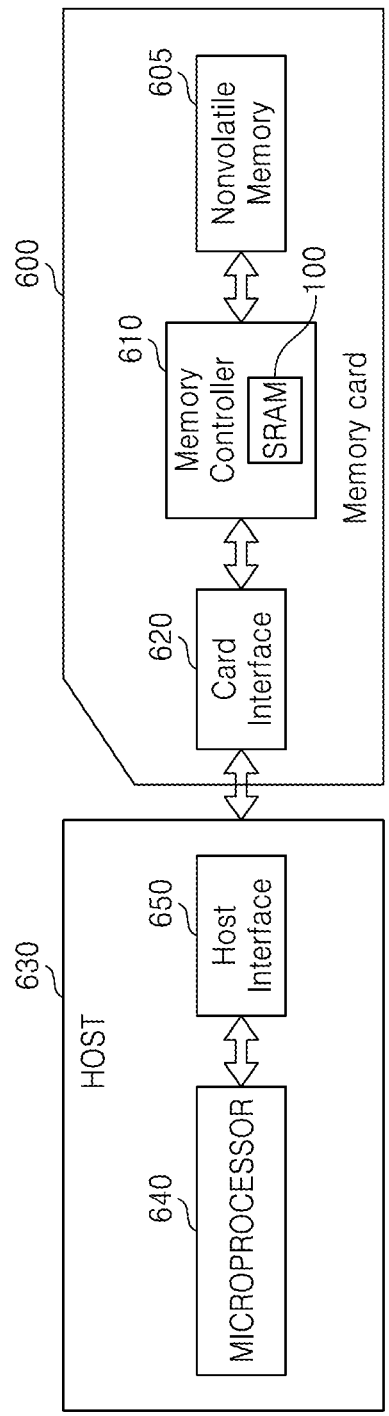
FIG. 9 is a diagram of a memory system including the memory device illustrated in FIG. 2 according to one or more exemplary embodiments.

FIG. 9 is a diagram of a memory system 600 including the memory device 100 illustrated in FIG. 2 according to one or more exemplary embodiments. The memory system 600 may be implemented as a memory card or a smart card. The memory system 600 includes a nonvolatile memory 605, a memory controller 610, and a card interface 620.

The memory controller 610 may control data exchange between the nonvolatile memory 605 and the card interface 620. The card interface 620 may be a secure digital (SD) card interface or a multi-media card (MMC) interface, but the inventive concept is not restricted to this. The card interface 620 may interface a host 630 and the memory controller 610 for data exchange according to a protocol of the host 630.

The memory controller 610 temporarily stores data output from the nonvolatile memory 605 in the SRAM 100 within the memory controller 610. The data stored in the SRAM 100 may be transmitted to the card interface 620.

The card interface 620 may support a USB protocol and an IC-USB protocol. Here, the card interface 620 may indicate hardware supporting a protocol used by the host 630, a software installed in the hardware, or a signal transmission mode.

When the memory system 600 is connected with the host 630 such as a PC, a tablet PC, a digital camera, a digital audio player, a cellular phone, console video game hardware, or a digital set-top box, a host interface 650 of the host 630 may perform data communication with the nonvolatile memory 605 through the card interface 620 and the memory controller 610 according to the control of a microprocessor 640.

Figure 10:
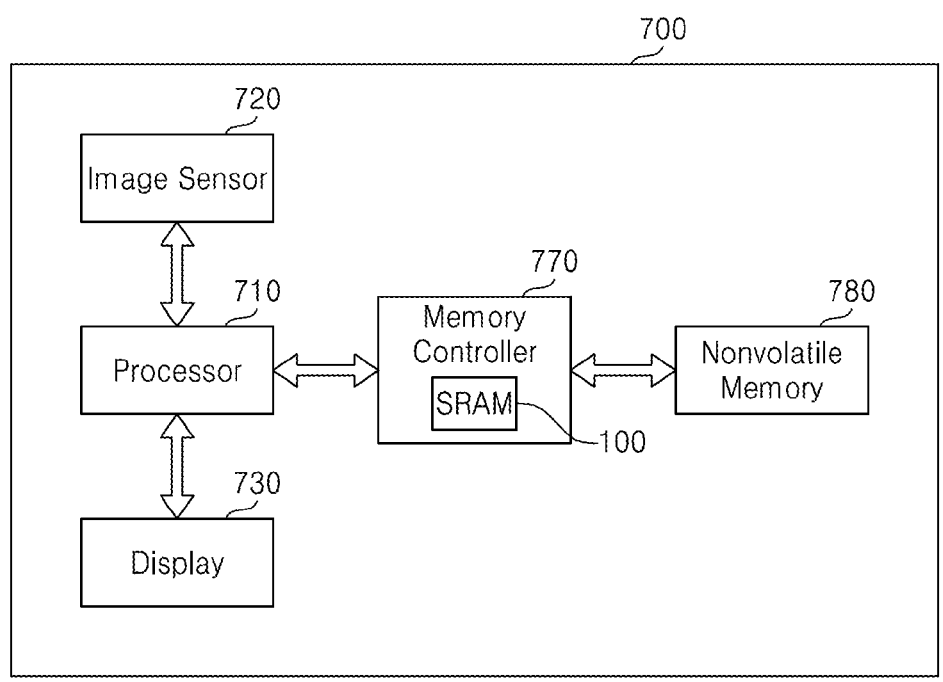
FIG. 10 is a diagram of a memory system including the memory device illustrated in FIG. 2 according to one or more exemplary embodiments.

FIG. 10 is a diagram of a memory system 700 including the memory device 100 illustrated in FIG. 2 according to one or more exemplary embodiments. The memory system 700 may be implemented as an image processor like a digital camera, a cellular phone equipped with a digital camera, a smart phone equipped with a digital camera, or a tablet PC equipped with a digital camera.

The memory system 700 includes a memory controller 770 controlling the data processing operations, such as a program operation, an erase operation, and a read operation, of a nonvolatile memory 780. The memory controller 770 includes the memory device 100 implemented by an SRAM which temporarily stores data output from the nonvolatile memory 780 or data to be output to the nonvolatile memory 780.

An image sensor 720 included in the memory system 700 converts an optical image into a digital image and outputs the digital image to a processor 710 or the memory controller 770. According to the control of the processor 710, the digital image may be displayed through a display 730 or stored in the nonvolatile memory 780 through the memory controller 770. Data stored in the nonvolatile memory 780 is displayed through the display 730 according to the control of the processor 710 or the memory controller 770.

The memory controller 770, which may control the operations of the nonvolatile memory 780, may be implemented as a part of the processor 710 or as a separate chip.

Figure 11:
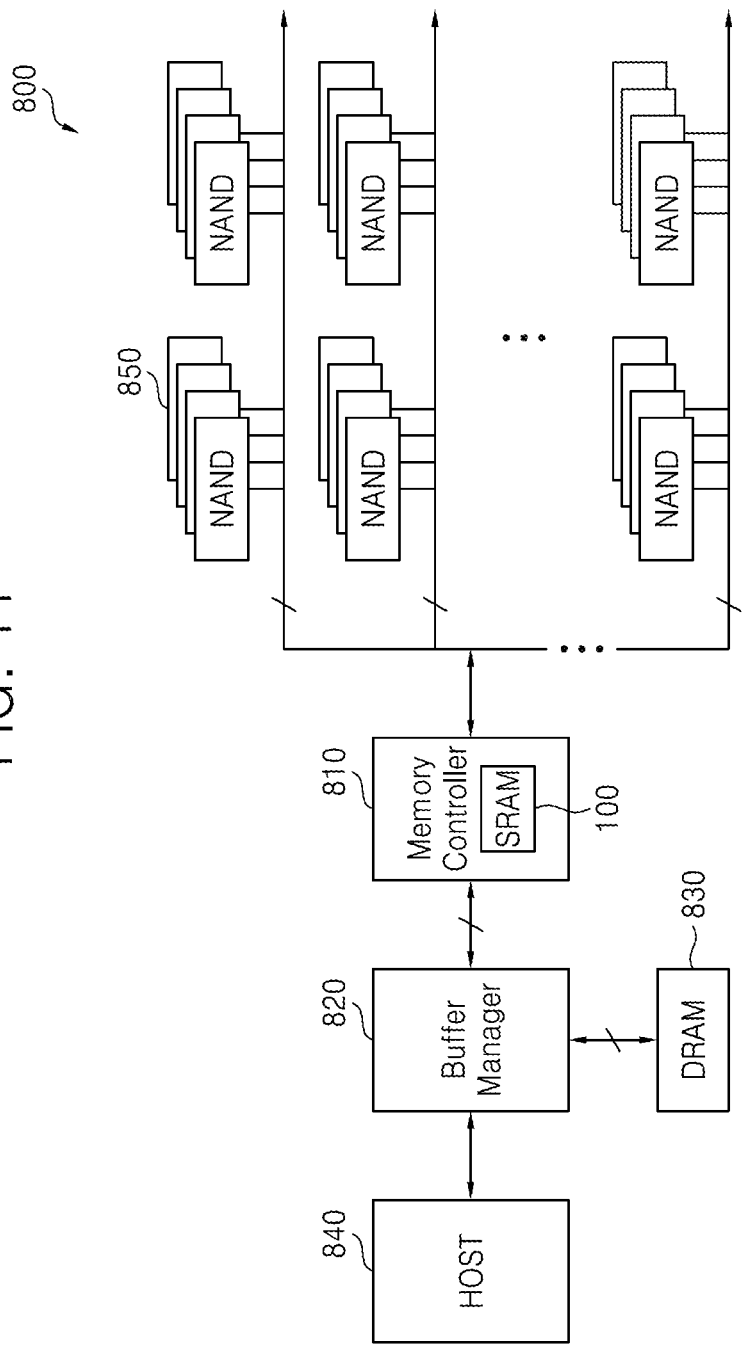
FIG. 11 is a diagram of a memory system including the memory device illustrated in FIG. 2 according to one or more exemplary embodiments.

FIG. 11 is a diagram of a memory system 800 including the memory device 100 illustrated in FIG. 2 according to one or more exemplary embodiments. The memory system 800 may be implemented as a data storage system like a solid state drive (SSD). The memory system 800 includes a plurality of nonvolatile memories 850, a memory controller 810 controlling the data processing operations of the nonvolatile memories 850, a DRAM 830, and a buffer manager 820 controlling data transferred between the memory controller 810 and a host 840 to be stored in the DRAM 830.

The memory controller 810 includes the memory device 100 implemented by an SRAM. The SRAM 100 may temporarily store data output from the nonvolatile memories 850 and then transmit the data to the DRAM 830 according to the control of the buffer manager 820.

The memory controllers 340, 450, 540, 610, 770 and 810 described in the different exemplary embodiments above include the SRAM 100 and a microprocessor (not shown) which controls the operations, e.g., a write operation and a read operation, etc., of the SRAM 100.

As described above, according to one or more exemplary embodiments, a memory device and systems including the memory device adjust an activation timing of a control signal for operating the memory device using a variable delay circuit, thereby stabilizing memory cell characteristics.

While the inventive concept has been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. A memory device comprising:
a memory cell array;
an access control circuit which accesses the memory cell array to perform a read operation or a write operation;
a control signal generation circuit which generates a control signal for controlling an operation of the access control circuit; and
a variable delay circuit which generates a delay signal DS by variably delaying a clock signal CK by amount of delay set according to an external digital code EXS including a plurality of bits,
wherein the control signal generation circuit adjusts an activation timing of the control signal WLEN, PREN, SAEN and CCEN in response to the delay signal DS,
wherein the access control circuit which comprises a sense amplifier (S/A) & write driver block functions as a write driver which writes data received through data I/O circuit to the memory cell array during the write operation and functions as an S/A which senses and amplifies data output from the memory cell array and transmits the data to the data I/O circuit during the read operations,
wherein the external digital code EXS is input from outside of the memory device.

2. The memory device of claim 1, wherein the variable delay circuit comprises:
a delay setting circuit which sets an amount of delay of the variable delay circuit according to the external signal; and
a delay circuit which generates the delay signal by variably delaying the clock signal according to the amount of delay.

3. The memory device of claim 2, wherein the delay setting circuit comprises a register which stores the amount of delay.

4. The memory device of claim 2, wherein the delay circuit comprises a plurality of delay elements connected in series to each other, and each of the delay elements is a buffer or an inverter.

5. The memory device of claim 2, wherein the delay setting circuit comprises a plurality of fusing elements, and the amount of delay is determined according to a number of the fusing elements which are cut, or according to a number of fusing elements which are uncut.

6. The memory device of claim 1, wherein the memory device is a static random access memory (SRAM).

7. The memory device of claim 1, wherein the control signal is a sense amplifier enable signal for controlling an operation of a sense amplifier, a precharge enable signal for controlling a precharging operation of the sense amplifier, a word line enable signal for controlling an operation of a row decoder, or a column decoder enable signal for controlling an operation of a column decoder.

8. A memory controller comprising:
a memory device; and
a microprocessor which controls an operation of the memory device,
wherein the memory device comprises:
a memory cell array;
an access control circuit which accesses the memory cell array to perform a read operation or a write operation;
a control signal generation circuit which generates a control signal for controlling an operation of the access control circuit; and
a variable delay circuit which generates a delay signal DS by variably delaying a clock signal CK by an amount of delay set according to an external digital code EXS including a plurality of bits,
wherein the control signal generation circuit adjusts an activation timing of the control signal in response to the delay signal,
wherein the access control circuit which comprises a sense amplifier (S/A) & write driver block functions as a write driver which writes data received through data I/O circuit to the memory cell array during the write operation and functions as an S/A which senses and amplifies data output from the memory cell array and transmits the data to the data I/O circuit during the read operations,
wherein the external digital code EXS is input from outside of the memory device.

9. The memory controller of claim 8, wherein the variable delay circuit comprises:
a delay setting circuit which sets an amount of delay of the variable delay circuit according to the external signal; and
a delay circuit which generates the delay signal by variably delaying the clock signal according to the amount of delay.

10. The memory controller of claim 8, wherein the memory device and the microprocessor are implemented in a single chip.

11. A memory system comprising:
a nonvolatile memory; and
the memory controller of claim 8, the memory controller controlling an operation of the nonvolatile memory,
wherein the memory controller writes data output from the nonvolatile memory to the memory device using the access control circuit and transmits data from the access control circuit to the nonvolatile memory.

12. The memory system of claim 11, wherein the memory system is a multi-chip package.

13. A memory system comprising:
a display;
a nonvolatile memory; and
the memory controller of claim 8, the memory controller transmitting data from the nonvolatile memory to the display,
wherein the memory controller writes data output from the nonvolatile memory to the memory device using the access control circuit and transmits data from the access control circuit to the nonvolatile memory.

14. A memory card comprising:
a card interface;
a nonvolatile memory; and
the memory controller of claim 8, the memory controller interfacing with the card interface and the nonvolatile memory for data transmission.

15. A solid state drive comprising:
at least one nonvolatile memory;
the memory controller of claim 8, the memory controller controlling a data processing operation of each of the at least one nonvolatile memory; and
a buffer manager which controls data transmitted between the memory controller and a host to be stored in a volatile memory device.

16. A memory device comprising:
a sense amplifier that performs a read operation on a memory cell array;
a variable delay circuit that variably delays a clock signal according to amount of delay set by an external digital code including a plurality of bits to produce a variable delay signal; and
a control signal generation circuit that, after a delay according to the variable delay signal, generates a sense amplifier enable signal for causing the sense amplifier to sense and amplify a voltage of a bit line and a complementary bit line of the memory cell array wherein the variable delay circuit comprises:
a delay circuit which comprises a plurality of delay elements connected in series to each other, each of the delay elements comprising a buffer or an inverter,
a delay setting circuit comprising a register which stores the amount of delay corresponding to the external digital code, and which variably controls the number of delay elements connected in series according to the amount of delay stored in the register to variably delay the clock signal.

17. The memory device of claim 16, wherein the variable delay circuit comprises a plurality of fusing elements, and an amount of the delay is determined according to a number of the fusing elements which are cut, or according to a number of fusing elements which are uncut based on the external signal, the cut or uncut state of the fusing elements being determined according to a value corresponding to the external digital code.

* * * * *